United States Patent [19]

Owens et al.

[11] Patent Number: 5,220,192
[45] Date of Patent: Jun. 15, 1993

[54] RADIATION HARDENED CMOS STRUCTURE USING AN IMPLANTED P GUARD STRUCTURE AND METHOD FOR THE MANUFACTURE THEREOF

[75] Inventors: Alexander H. Owens, Santa Clara; Mike Lyu, Saratoga; Shahin Toutounchi, Pleasanton; Abraham Yee, Santa Clara, all of Calif.

[73] Assignee: LSI Logic, Milpitas, Calif.

[21] Appl. No.: 911,861

[22] Filed: Jul. 10, 1992

[51] Int. Cl.[5] .................... H01L 27/12; H01L 21/265
[52] U.S. Cl. ..................... 257/519; 257/547; 257/648; 257/921; 437/40; 437/63; 437/70; 437/50; 437/196
[58] Field of Search ............. 257/519, 547, 648, 921; 437/40, 63, 70, 50, 196

[56] References Cited

U.S. PATENT DOCUMENTS 4,498,227  2/1985  Howell et al. .................. 257/519

Primary Examiner—Edward Wojciechowicz
Attorney, Agent, or Firm—Gerald E. Linden; Michael D. Rostoker

[57] ABSTRACT

A radiation hardened NMOS transistor structure suited for application to radiation hardened CMOS devices, and the method for manufacturing it is disclosed. The new transistor structure is characterized by "P" doped guard bands running along and immediately underlying the two bird's beak regions perpendicular to the gate. The transistor and the CMOS structure incorporating it exhibit speed and size comparable to those of conventional non-rad-hard CMOS structure, relatively simple manufacturing, and excellent total-dose radiation hardness.

12 Claims, 8 Drawing Sheets

RADIATION HARDENED CMOS STRUCTURE USING AN IMPLANTED P GUARD STRUCTURE AND METHOD FOR THE MANUFACTURE THEREOF

TECHNICAL FIELD OF THE INVENTION

The invention relates to semiconductor processing, and more particularly to fabrication and processing of radiation-hardened CMOS structures.

BACKGROUND OF THE INVENTION

Much of today's high-density integrated circuitry has been made possible by small-geometry CMOS (Complementary Metal Oxide Semiconductor) technology, well known to those skilled in the art of semiconductor processing. Most modern microprocessors and large-scale integrated circuits are made using small-geometry CMOS processes (2 micron line widths and below). Two of the biggest advantages of CMOS technology are: 1) its inherently high noise immunity (due to relatively large voltage differences between CMOS logic output voltages and input switching thresholds compared to other logic families), and 2) low power dissipation.

CMOS technology is particularly desirable in military and aerospace applications because of these noise and power characteristics. However, military and aerospace environments tend to be characterized by high levels of radiation, particularly gamma and X-ray radiation, and standard CMOS circuits are known to have some problems with high-radiation environments. While it is possible to construct radiation shields for CMOS military applications, this tends to add weight, expense, and complexity; requires extensive testing; and negates much of the desirability of CMOS for these applications.

Also well known to those skilled in the art is that CMOS technology is typified by logic gates constructed from complementary pairs of MOS Field Effect Transistors (FET's) (p-channel and n-channel) in a sort of a push-pull configuration where only one transistor of any given pair is "on" at a time, such that CMOS gates (ideally) draw no steady-state current. The inputs to CMOS gates, being the unloaded gates of insulated-gate FET's (MOS transistors are also known as insulated-gate field effect transistors, or IGFETs, by virtue of an insulating layer of $SiO_2$ between the gate and the active channel area of the transistor), draw no steady-state current, either. The only currents drawn by CMOS circuitry are due to leakages and to switching currents, which result from the charging and discharging of parasitic capacitances at the time of a logic state change.

"Radiation hardness" refers to the ability of a semiconductor device to withstand radiation without alteration of its electrical characteristics. A semiconductor device is said to be radiation hardened (rad-hard), radiation tolerant, or radiation resistant if it can continue to function within specifications after exposure to a specified amount of radiation. Semiconductor devices can be damaged or destroyed by the effects of nuclear radiation from natural and man-made sources. Radiation changes the electrical properties of solid state devices, leading to possible failure of any system incorporating them.

Gamma rays, X rays, and neutron bombardment have proven to be the most harmful forms of radiation. Rad-hard devices and circuits have been developed to minimize the effects of these forces. The devices can be designed to be rad-hard, or the normal manufacturing process can be modified to produce rad-hard devices with special isolation techniques. Radiation hardening now permits systems designers to take advantage of the benefits of CMOS technology in high-performance, high-reliability products intended for applications where radiation is present.

The following sources of radiation are of particular interest in the present context:

Charged Particles

An alpha particle is a helium nucleus or a helium atom without its electrons. It travels at close to the speed of light, but can be stopped by a sheet of paper.

A beta particle is an electron traveling at nearly the speed of light. The same as an electron orbiting a nucleus, it differs only in speed. The beta particle can travel about 20 feet in air and is stopped by 1/16 inch thick aluminum barriers.

Ions are charged particles formed when one or more electrons are removed or added to a previously neutral atom or molecule. The are, for example, silicon ions.

Neutrons

A neutron is a particle without electric charge. It has a mass that is approximately equal to that of a proton. Neutrons are naturally bound to the nucleus of an atom, but they can be displaced in various types of nuclear interactions.

Photons

Gamma rays are photons or quanta of energy with characteristics that are identical to those of X rays. The difference between gamma rays and X rays is their source. Gamma rays come from the atomic nucleus, but X rays are generated by processes outside the nucleus. Gamma rays and X rays have no electrical charge, travel at the speed of light, and can be stopped by a concrete or lead shield.

The interactions of a particle with a material will depend on the properties of each. The properties of particles are: 1) mass, 2) charge, and 3) kinetic energy. The properties of materials are: 1) mass, 2) charge, and 3) density.

The interaction of particles and energies can be classified as two main mechanisms:

1. Displacement of atoms from their lattice structure (displacement damage), and
2. Generation of electron-hole pairs (ionization).

These dominate the effect of radiation in materials of concern in electronics, and both can cause temporary (transient) or permanent damage to semiconductors.

The energy transferred to a material by ionizing radiation is measured in rads (radiation absorbed dose). One rad is equal to the energy of 100 ergs per gram of material. The material must be specified, because this energy will differ with each material. The ionizing dose rate for silicon-based (Si based) semiconductors is referred to in rads(Si)/second. Particles are referred to in terms of concentration as well as the time integral of concentration:

Flux = Particles per square centimeter x seconds

Fluence = Particles per square centimeter

Displacement damage is caused by heavy charged particles and neutrons. Neutron radiation presents more problems in bipolar devices than in CMOS devices until a fluence of $10^{15}$ neutrons per square centimeter or greater is reached. Heavily charged particles can cause single event upset.

Ionization is the principal agent that damages or destroys CMOS devices. It is caused by photon (gamma or X ray) interactions, fast neutron interactions, and charged (alpha and beta) particles. However, of these, gamma and X-radiation are the primary sources of this ionization.

As the dose of ionizing radiation increases, the number of carriers generated in silicon will increase. Out in space it might take many years for a device to absorb high levels of radiation. For example, it might take 20 years for an IC (integrated circuit) to absorb a total dose of 100,000 rads(Si). However, in the presence of a nuclear explosion, a device might reach this total dose within hundreds of nanoseconds. This type of pulse photon exposure is referred to as (extreme) transient radiation.

Particularly troublesome to CMOS devices in high radiation environments are active parasitic devices which occur within the CMOS devices themselves, particularly field isolation MOS ("field transistor", or "parasitic field transistor"; used interchangeably herein) and parasitic SCR (silicon controlled rectifier) structures. These structures are well known to those skilled in the art of semiconductor processing. NMOS (the n-channel part of the complementary pairs of transistors in CMOS structures) field transistor leakage and parasitic SCR latch-up are known to cause fatal (unrecoverable) misoperation of CMOS designs in high radiation environments. NMOS field transistor leakage is known to be induced by large negative threshold shifts in parasitic field transistors as a cumulative effect of radiation. This effect, being cumulative, permanently destroys the usefulness of CMOS devices over time as a function of the total dose of radiation received by the CMOS devices. Latch-up is known to occur as a result of the "firing" of parasitic SCR structures by transient radiation. This causes an unrecoverable misoperation of the associated CMOS device which (if it doesn't destroy the device) may only be cleared by completely removing power from the CMOS device and allowing the parasitic SCR to turn off. For all intents and purposes, if latch-up occurs it renders the CMOS device useless.

As a result of the particular sensitivity of NMOS transistors to radiation-induced damage, this is an area of special concentration in the design of rad-hard semiconductor devices. In fact, many radiation hardening techniques apply only to the NMOS transistors of a CMOS structure. It is these NMOS-only radiation hardening techniques which are of primary relevance and interest herein.

The problem of parasitic SCR latch-up for high-radiation (and normal-radiation) environments has been thoroughly discussed and numerous solutions have been provided. Techniques to prevent parasitic SCR latch-up are well-known in the present art and are not relevant to this specification.

Numerous radiation tolerant (rad-hard) designs of CMOS devices have been proposed and implemented. Typically, these designs are significantly larger and/or slower than their conventional CMOS counterparts. Examples of present techniques for creating rad-hard CMOS devices and the characterization thereof are given in: H. Hatano and Satoru Takatsuka, "Total Dose Radiation-Hardened Latch-up Free CMOS Structures for Radiation-Tolerant VLSI Designs", IEEE Trans. Nucl. Sci., vol NS-33, no. 6, 1986, (hereinafter "HATANO 1"); Hiroshi Hatano and Satoru Takatsuka, "Radiation-Tolerant 50 MHz Bulk CMOS VLSI Circuits Utilizing Radiation-Hard Structure NMOS transistors", IEEE Trans. Nucl. Sci., vol. NS-33, no. 5, 1986, (hereinafter "HATANO 2"); and I. Yoshii, K. Hama, K Maeguchi, S. Takatsuka, and H. Hatano, "Total-Dose Characterization of a High-Performance Radiation-Hardened 1.0-μm CMOS Sea-Of-Gates Technology", (hereinafter "HATANO 3").

Well known in the present art are the designations "P−", "P", and "P+" used to describe the doping concentrations of P-type dopants, and the corresponding designations "N−", "N", and "N+" used to describe the doping concentrations of N-type dopants. "P−" and "N−" designations apply to doping concentrations of $10^{14}$–$10^{16}$ atoms/cm$^3$ of P-type and N-type dopants, respectively. "P" and "N" designations apply to doping concentrations of $10^{16}$–$10^{19}$ atoms/cm$^3$ of P-type and N-type dopants, respectively. "P+" and "N+" designations apply to doping concentrations of $10^{19}$–$10^{21}$ atoms/cm$^3$ of P-type and N-type dopants, respectively.

HATANO 1 shows six rad-hard NMOS transistor structures which may be incorporated into CMOS devices, three of which ("Structures 4–6" therein) utilize a P+ guard band structure under thin oxide. In general, these three thin oxide "guard" band implementations are shown to have suitable total-dose radiation characteristics, but they suffer from relatively low density and speed compared to the other three structures ("Structures 1–3"). Of the three structures shown as "Structures 4–6" in HATANO 1, "Structure 6" is slightly smaller, and exhibits better speed response. It is this structure which is of primary interest herein.

FIGS. 1a–1c illustrate "Structure 6" of HATANO 1. FIG. 1a shows a top view of an NMOS transistor 100 wherein a P+ guard ring 130 and N+ source and drain diffusion regions, 140a and 140b, respectively, underlie an oxide layer 120. An overlying poly-silicon ("poly") gate structure 150 is shown. Guard ring 130 is shown as having two segments 130a and 130b running perpendicular to the gate structure, and two segments 130c and 130d running parallel to the gate structure. Two section lines A—A' (for which FIG. 1b is a representative section), and B—B' (for which FIG. 1c is a representative section) are shown.

FIG. 1b shows a section A—A' of NMOS transistor 100 wherein the poly-silicon gate 150 is shown overlying thick field oxide layer segment 120a, and a thin gate oxide layer segment 120c. Oxide layer segments 120a–c are all components of oxide layer 120 (FIG. 1a). P+ guard ring 130 is diffused into a P− well 110 into which the NMOS transistor is fabricated, and is shown as two sections underlying the interfaces between thick oxide layer segments 120a and 120b and thin oxide layer sections 120c, 120d and 120e, respectively. These interfaces 120d and 120e are commonly called "bird's beak" sections, due to the similarity of their shape to the head and beak of a bird. N+ source (or drain) diffusion region 140b, diffused into P-well 110, is shown as a dashed line since source and drain diffusion regions are absent under the gate structure 150. The area under the gate structure 150 between the source and drain diffusion regions 140a and 140b is known as the "channel area".

It is well known in the present art that trapped charges occur under bird's beak structures which can cause low threshold voltages in parasitic MOS transistor structures, resulting in high leakage current around NMOS transistor 100 under normal operating conditions (often referred to as "field inversion"). A P+ guard ring 130, as shown, dramatically increases the threshold of the parasitic transistor(s), reducing the problem of field inversion.

It should be noted, with respect to FIG. 1b, that the gate structure 150 does not continue onto thick gate oxide segment 120b, but is "pulled back". This minimizes the possibility of field inversion under oxide layer 120b. While this is advantageous for the purposes of HATANO 1, some CMOS design constraints do not permit the gate to be pulled back, limiting the usefulness of this structure for those applications.

FIG. 1c shows a section B—B' of NMOS transistor 100, away from gate structure 150 and through N+ drain (or source) diffusion region 140b. Again, thick field oxide layer sections 120a and 120b, and thin gate oxide section 120c are shown overlying P— well 110, into which P+ guard ring 130 and N+ drain diffusion region 140b have been separately diffused.

The doping density of the P+ guard ring 130 in NMOS transistor 100 necessitates a relatively large distance between the N+ source and drain diffusion regions (140a and 140b) and the guard ring 130 in order to minimize parasitic capacitances therebetween. The fact that guard ring 130 is actually a complete ring also tends to increase the area over which capacitances between the guard ring and source and drain diffusion regions 140a and 140b may occur. These parasitic capacitances slow the switching response of the NMOS transistor 100, and any associated CMOS device, accordingly. As a result, significant tradeoffs must be made between transistor speed and size. It is for this reason, that HATANO 1 shows rad-hard Structure 6 (FIGS. 1a–c herein) as being 59% larger (in area) than a similar conventional CMOS gate. The additional size is due, at least in part, to the distance it is required to space the P+ guard ring (130) away from the source and drain diffusion regions (140a and 140b) so that the effect of parasitic capacitance on device speed will be minimal.

The portions 130a and 130b of P+ guard ring 130 which run perpendicular to the gate 150 compensate primarily for an effect known as "poly field inversion" or "gate field inversion" (activation of active parasitic transistors due to fields from the gate structure). The portions 130c and 130d of P+ guard ring 130 which run parallel to the gate 150 compensate primarily for an effect known as "metal field inversion" arising from activation of parasitic devices by fields from metal contacts to the source and drain diffusion regions (not shown).

One problem in the approach described hereinabove is in the area of manufacturability. The separate implantation of a P+ guard ring (a relatively high concentration) requires expensive implanter time. Ideally, the time required to perform additional process steps (particularly on expensive equipment) should be minimized to improve the cost-effectiveness of the fabrication process (and therefore the cost of the final device). Another problem is in the size of the NMOS device necessitated by the spacing between the P+ guard ring and the source and drain diffusion regions.

These problems notwithstanding, guard structures have significant advantages in the area of total dose radiation hardness, by virtue of their very effective control of the active parasitic device thresholds.

DISCLOSURE OF THE INVENTION

It is therefore an object of the present invention to provide a technique for manufacturing CMOS devices containing rad-hard NMOS transistors which minimizes the amount of implanter time required for steps over and above those required for conventional CMOS devices.

It is a further object of the present invention to provide a CMOS structure containing rad-hard NMOS transistor structures utilizing guard structures, which requires only minimal size increase over conventional CMOS devices.

It is a further object of the invention to provide a CMOS structure containing rad-hard NMOS transistor structures utilizing guard structures, which operates at speeds comparable to those of conventional NMOS transistors.

It is a further object of the invention to provide a CMOS structure containing rad-hard NMOS transistors utilizing techniques which substantially increase the thresholds of the parasitic field transistors.

According to the invention, a conventional CMOS structure characterized by thick field oxide around the NMOS transistors; thin gate oxide over N+ source and drain diffusion regions, a channel area under a poly-silicon gate overlying and between the source and drain structures, and relative immunity to metal field inversion (provided by techniques well known to those skilled in the art of semiconductor processing), is prepared up to a point prior to the fabrication of the gate structure. A photo-mask is applied and a two-part P ($10^{18}$–$10^{20}$ atoms/cm$^3$) guard structure is photo-implanted into each NMOS transistor structure such that each part will immediately underlie one of the two bird's-beak oxide structures running perpendicular to the path of the gate. The remaining CMOS device structure is completed normally.

By using a CMOS structure which is relatively immune to metal field inversion, the need for the complete guard ring of the prior art (e.g., Structure 6 of HATANO 1) is eliminated. For example, the portion of the ring which runs parallel to the gate structure in Structure 6 of HATANO 1 (see FIG. 1a) is not necessary in the present invention. This reduces the size of the rad-hard NMOS transistor significantly by eliminating the space required by such parallel portion of the guard structure. This also helps further reduce the size and/or speed of the NMOS transistor by reducing the total parasitic capacitance. By reducing the parasitic capacitance, it is then possible to reduce the spacing between the guard structure and the N+ source and drain diffusion regions for the same level of capacitance, further reducing device size. Alternatively a benefit in NMOS transistor speed may be achieved for the same device size.

By using a P material for the guard structure, rather than the P+ material used for the guard structure in Structure 6 of HATANO 1, the active parasitic device thresholds are still effectively controlled (increased), but the lower doping density permits significantly less distance between the guard structure and the source and drain diffusion regions at the same or lower levels of parasitic capacitance as those in the technique of the prior art. For the purposes of the present invention, a P+ doping density for the guard structure (such as that used in the guard ring of Structure 6 of HATANO 1) would be "overkill", and would require significant increases in device size in order to maintain reasonable performance.

Total-dose radiation effects have their greatest impact on NMOS transistors in CMOS technology, due to the characteristics of the NMOS materials and the manner in which they are altered by radiation exposure. As a result, the techniques of the present invention apply only to NMOS devices in a CMOS structure, not to PMOS devices.

By using the technique described hereinabove for improving the radiation hardness of an NMOS transistor, and incorporating them into an appropriate CMOS structure, rad-hard CMOS devices can be constructed which exhibit excellent total-dose radiation hardness, perform at speeds comparable to those of normal (non rad-hard) CMOS devices, are comparable in size to normal CMOS devices, and are readily manufacturable, requiring minimal additional implanter time.

Other objects, features and advantages of the invention will become apparent in light of the following description thereof.

BRIEF DESCRIPTION OF THE DRAWINGS

FIG. 1b is a cross-sectional view of the rad-hard NMOS transistor of FIG. 1a.

FIG. 1c is another cross-sectional view of the rad-hard NMOS transistor of FIG. 1a.

FIG. 2b is a top view of the rad-hard transistor of FIG. 2a.

FIG. 2c is a cross-sectional view of the rad-hard NMOS transistor of FIG. 2a.

DETAILED DESCRIPTION OF THE INVENTION

Figure 1A:
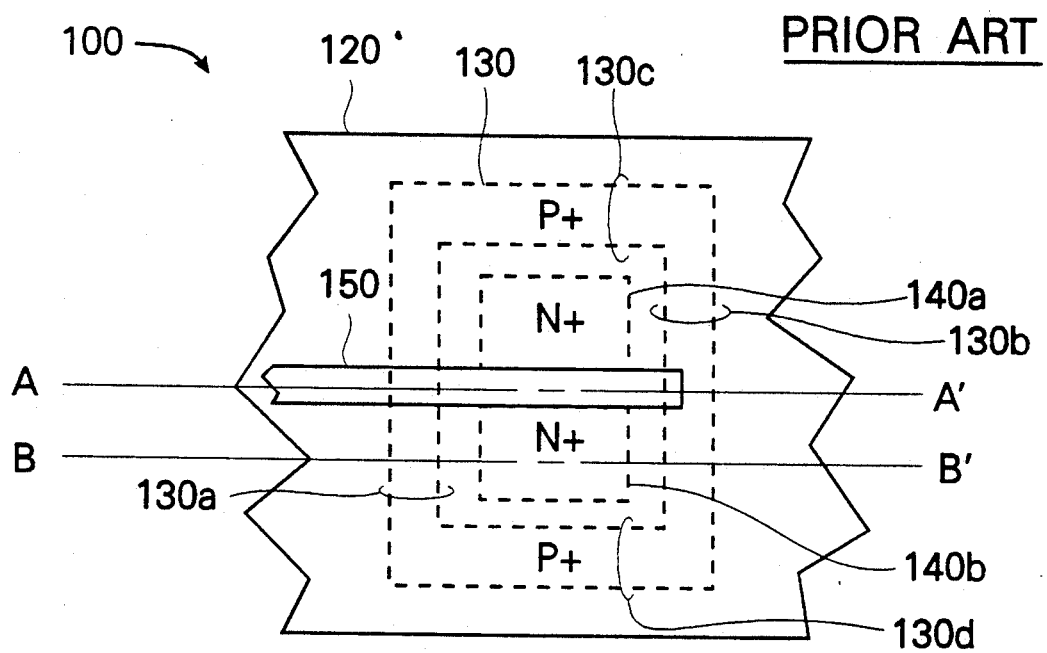
FIG. 1a is a top view of a rad-hard NMOS transistor of the prior art.
Figure 1B:
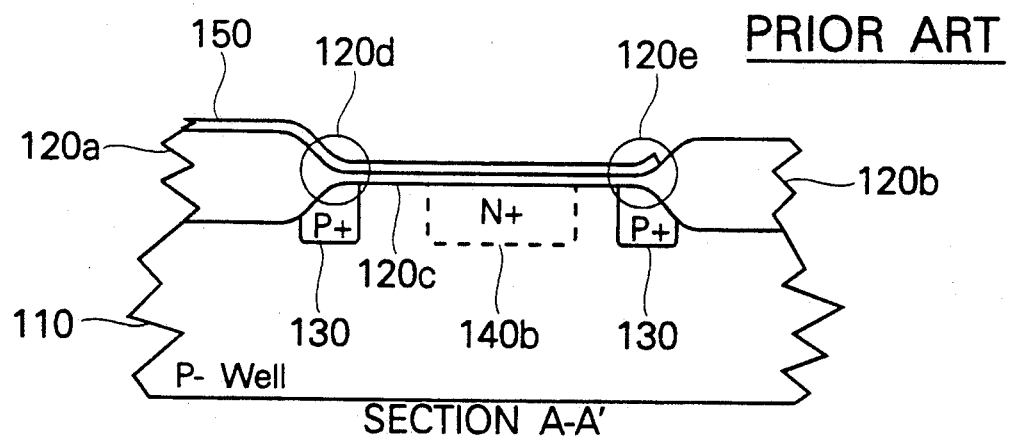
Figure 1C:
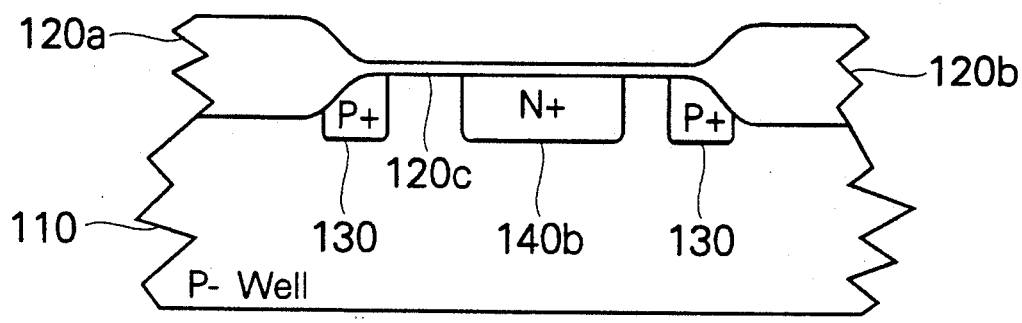

FIGS. 1a-1c show a prior-art rad-hard NMOS transistor which, when used in a CMOS device, provides good total-dose radiation hardness, but which is substantially larger and somewhat slower than comparable conventional CMOS devices.

Figure 2A:
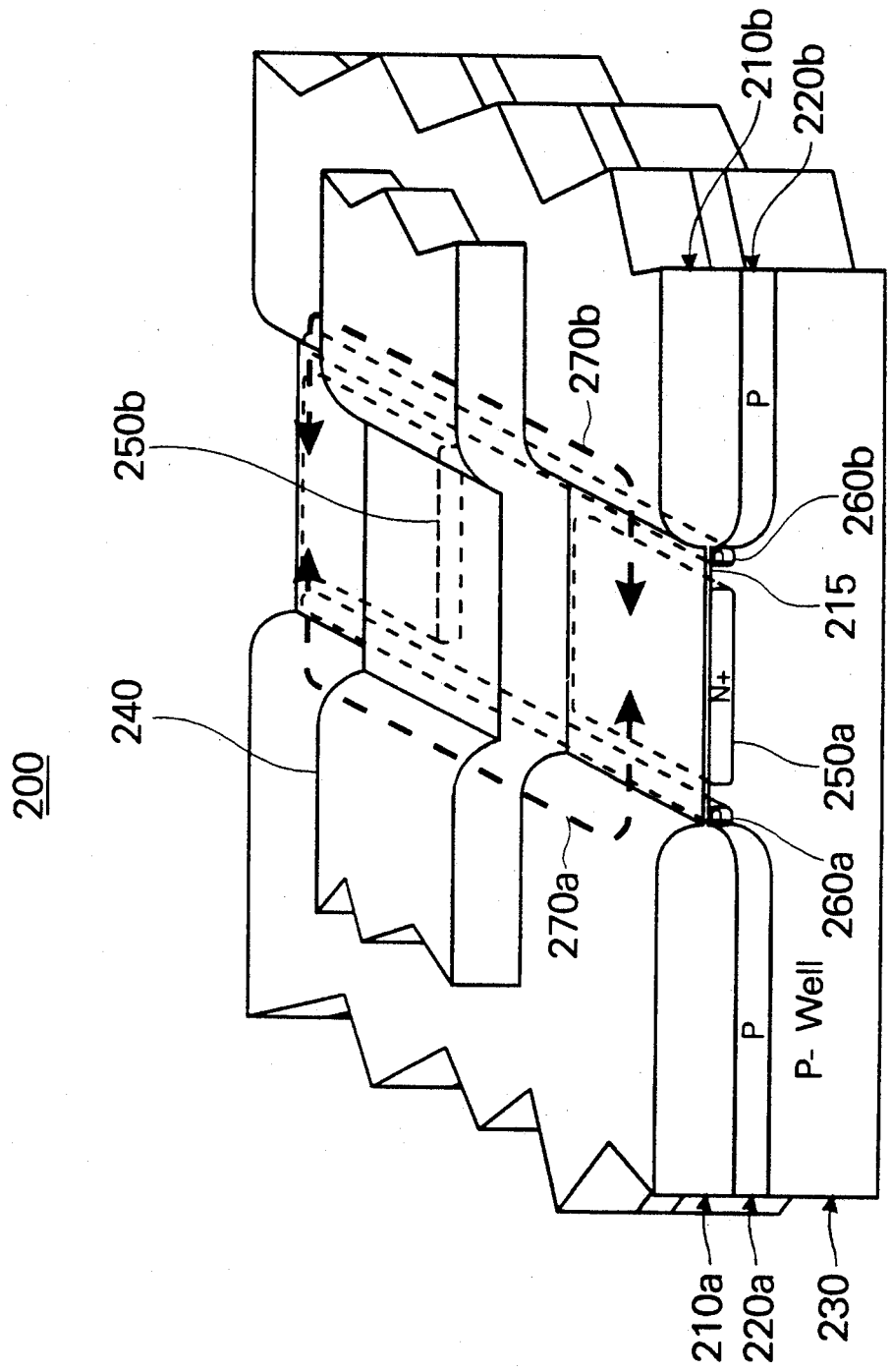
FIG. 2a is an isometric view of a rad-hard NMOS transistor, as it relates to the present invention.
Figure 2B:
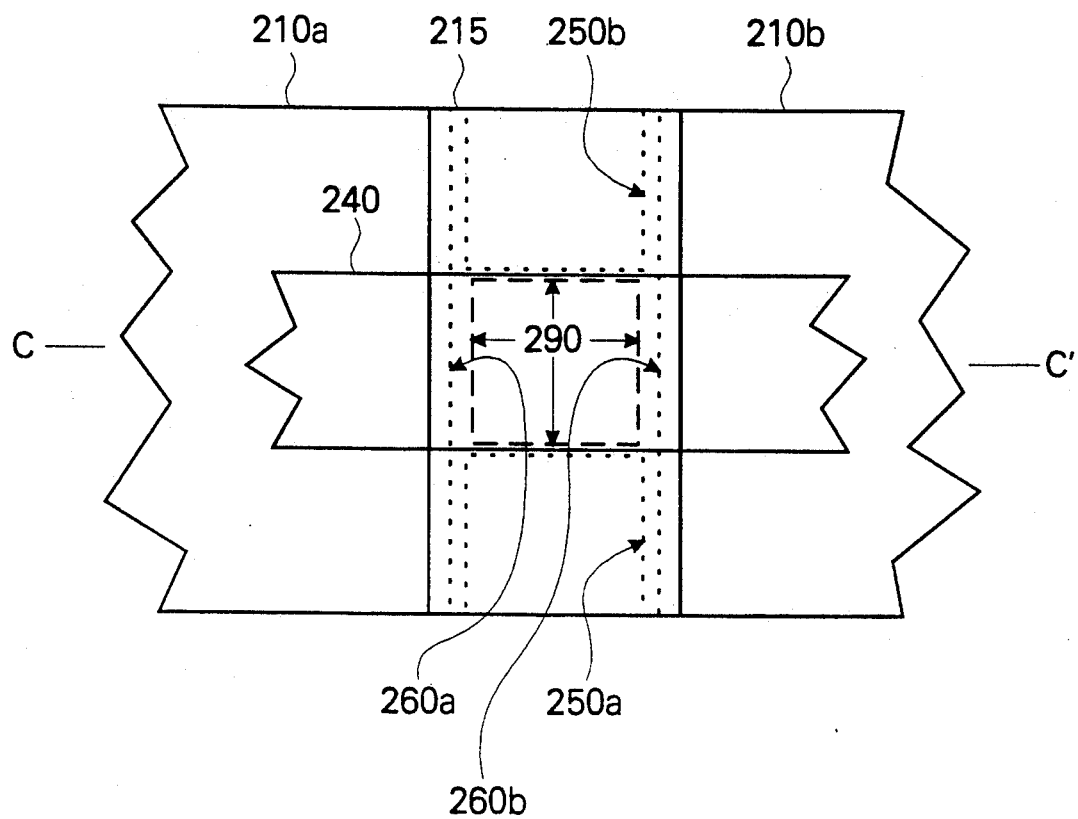
Figure 2C:
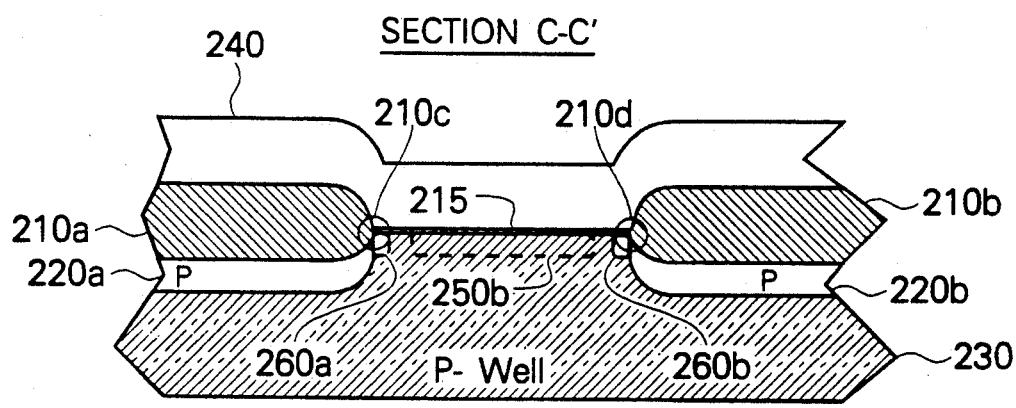

FIGS. 2a-2c show different views of an embodiment of a rad-hard NMOS transistor, as it relates to the present invention.

FIG. 2a shows an isometric view of a section of an embodiment of a rad-hard NMOS transistor 200 according to the present invention. There is a P− well 230, into which P doped regions 220a and 220b have been implanted under thick field oxide segments 210a and 210b, respectively. A thin gate oxide segment overlies P− well 230 and joins thick gate oxide segments 210a and 210b. A poly-silicon gate structure 240 overlies the three oxide segments. There are a first rectangular N+ diffusion region 250a and a second rectangular N+ diffusion region 250b, immediately underlying the thin field oxide segment 215 on either side of poly-silicon gate structure 240. These two N+ diffusion regions 250a and 250b interchangeably act as source and drain of the NMOS transistor. (If the first N+ diffusion region 250a is chosen as the source, then the second N+ diffusion region 250b acts as the drain. Conversely, if the first N+ diffusion region 250a is chosen as the drain, then the second N+ diffusion region 250b acts as the source.) A space between the two N+ diffusion regions 250a and 250b in the P− well 230 underlying the poly-silicon gate structure 240 and the thin gate oxide segment 215 acts as a channel area (shown as 290 in FIG. 2b) of the NMOS transistor.

Immediately under the "bird's beak" interface (shown as 210c in FIG. 2c) of thick field oxide 210a and thin gate oxide 215, a P guard structure 260a is implanted such that it runs approximately the length of the area covered by the poly-silicon gate structure 240 and the two N+ diffusion regions 250a and 250b. A similar P guard structure 260b is implanted immediately under the "bird's beak interface (shown as 210d in FIG. 2c) between thick field oxide 210b and thin gate oxide 215, and running approximately the same length as P guard structure 260a.

FIG. 2a also shows parasitic field transistor leakage paths as arrows 270a and 270b. One parasitic transistor can occur generally along the path shown by arrow 270a. (The direction of current leakage is dependent upon the polarity of voltages applied to N+ diffusion regions 250a and 250b. The direction shown implies that 250a is chosen as the drain, or more positive diffusion region.) Leakage currents will flow along this path in the event that sufficient field inversion occurs to create a channel in the P− well along the path. P doped region 220a protects against this to some degree but, in conventional NMOS transistors, trapped charges under the bird's beak interface between field oxide 210a and gate oxide 215 can cause sufficient inversion of the P− material in the region of the bird's beak interface 210c (effectively lowering the threshold of the parasitic field transistor) to create a leakage path between the two N+ diffusion regions 250a and 250b, allowing leakage current to flow. At a minimum, this causes significantly increased power dissipation; at maximum, it can cause misoperation of the device which incorporates the NMOS transistor. This effect is particularly prone to long-term degradation due to cumulative effects of radiation. In the present invention, however, guard band 260a in combination with P doped region 220a substantially increases the threshold of the parasitic field transistor structure by substantially increasing the amount of charge required to cause inversion of the material in this area, dramatically reducing the likelihood of leakages being caused by trapped charges in the bird's beak region. A similar parasitic transistor leakage path is shown on the opposite side of the N+ diffusion regions by 270b. This parasitic transistor leakage path is effectively compensated by P guard band 260b in a manner similar to that previously described for P guard band 260a.

FIG. 2b shows a top view of the same NMOS transistor structure, more clearly illustrating the area relationships between the gate structure 240, the N+ diffusion regions 250a and 250b, and the P guard structures 260a and 260b. All other reference numbers are the same as for FIG. 2a and refer to the same features of the NMOS transistor. The channel area is generally indicated by 290. This channel area occurs in the P− well immediately below the thin oxide layer 215. In FIG. 2b, it can clearly be seen that the two N+ diffusion regions 250a and 250b do not extend under the gate structure. This is because the N+ diffusion process uses the gate structure as a mask. (In some processes, the N+ diffusion regions are actually formed by first implanting slightly larger N− diffusion regions, and then implanting N+ diffusion regions into them.) FIG. 2b also indicates a section line C—C' through the center line of the gate structure 240, along which line the cross-sectional view in FIG. 2c is taken.

FIG. 2c shows a cross-sectional view C—C' of rad-hard NMOS transistor 200 taken along the centerline of gate structure 240. All reference numbers and the structures they represent are the same as for FIGS. 2a and 2b. FIG. 2c more clearly shows the relationship between the gate structure 240, the oxide layer segments 210a, 210b, and 215, the N+ diffusion region 250b, the P guard bands 260a and 260b, and the P doped regions 220a and 220b. N+ diffusion region 250b is shown as a dashed line because the cross-sectional view is taken through the centerline of gate structure 240, under which the N+ diffusion regions do not extend. The P guard bands 260a and 260b are clearly shown under bird's beak regions 210c and 210d, respectively, and located in (and, by implication, extending through) the region under the gate 240.

FIGS. 2a–2c show the structure of a rad-hard NMOS transistor, and the discussion related thereto describes the features and mechanisms by which the transistor is made radiation-hard. In the ensuing discussion with regard to FIGS. 3a–d, the method of manufacturing a CMOS structure incorporating such a rad-hard NMOS transistor is described.

FIGS. 3a–3d show cross-sectional views of a rad-hard CMOS structure incorporating the techniques of the invention, at various process steps.

Figure 3A:
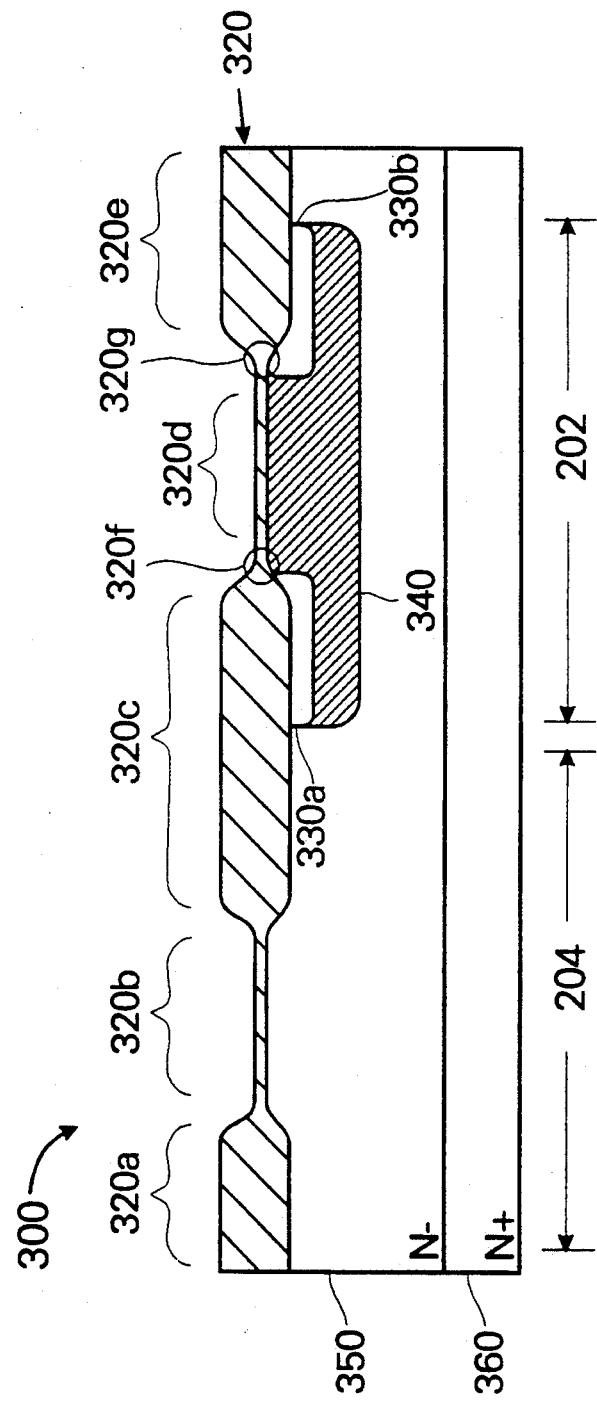
FIG. 3a is a cross-sectional view of a conventional CMOS structure at a point in the fabrication process immediately prior to gate oxidation as it relates to the present invention.

FIG. 3a shows a cross-sectional view of an incomplete typical CMOS structure at a point in the fabrication process before deposition of a gate structure. The plane of this cross-sectional view runs along the center line of the path of the gate structure to be formed overlying the structure shown. In the embodiment shown, a substrate material has been chosen comprising a base N+ material 360 underlying an N− material 350. In this substrate material, a P− well 340 has been created. Two P structures 330a and 330b are shown implanted into P− well 340 under thick portions 320c and 320e of overlying oxide layer 320 (330a and 330b are similar to 220a and 220b with respect to FIGS. 2a, 2c). Overlying oxide layer 320 has been created, appropriately etched, and processed to form thick oxide segments 320a, 320c, and 320e, and thin oxide segments 320b and 320d, shown in this cross-sectional view. Thin oxide segment 320b will act as a thin gate oxide for a PMOS transistor which will be located generally in the region indicated by 204. Thin oxide segment 320d will act as a thin gate oxide for an NMOS transistor which will be located generally in the region indicated by 202. Bird's beak regions 320f is shown at the interface of thick oxide 320b and thin oxide 320d, and bird's beak region 320g is shown at the interface of thick oxide 320e and thin oxide 320d.

Figure 3B:
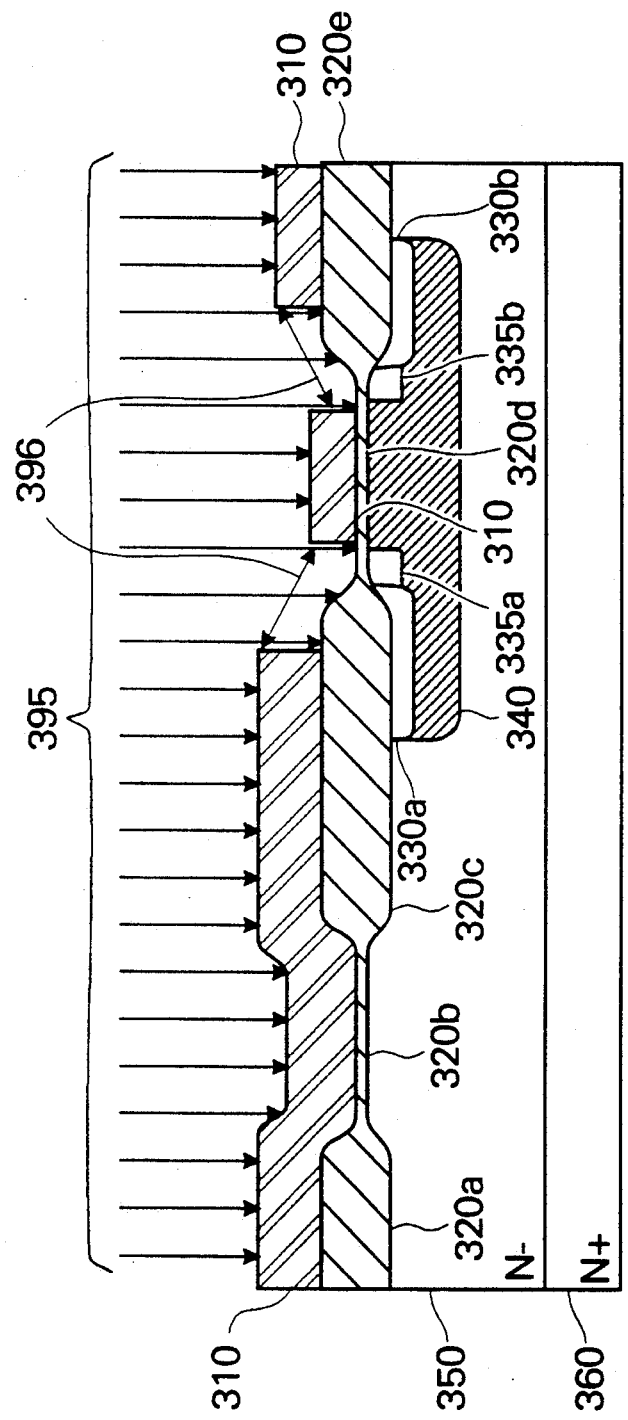
FIG. 3b is a cross-sectional view of a rad-hard CMOS structure incorporating the rad-hard NMOS transistor of the present invention at a point in the fabrication process illustrating the implantation of the guard structure.

FIG. 3b shows the CMOS structure of FIG. 3a after an overlying layer of a patterned photo-resist masking material 310 has been deposited, and during photo implantation by an implantation process 395 of two P guard structures 335a and 335b. Photo-resist masking layer 310 has elongated openings 396, through which the implantation occurs. For the process shown, thicker portions of thick oxide segments 320c and 320e also tend to act as masks for the implantation process 395, limiting the implantation to the area under bird's beak structures 320f and 320g (FIG. 3a). Upon completion, guard bands 335a and 335b are in contact with and conductive to the P material of P structures 330a and 330b. Guard bands 335a and 335b are similar to guard bands 260a and 260b with respect to FIGS. 2a and 2c. Note that these guard bands differ from the guard ring of FIGS. 1a–c (Structure 6 of HATANO 1) in that they do not connect to form a ring, and in that they are formed of a P material rather than a more heavily doped P+ material. After implantation of the P guard structures 335a and 335b, the CMOS structure is completed in normal fashion.

Figure 3C:
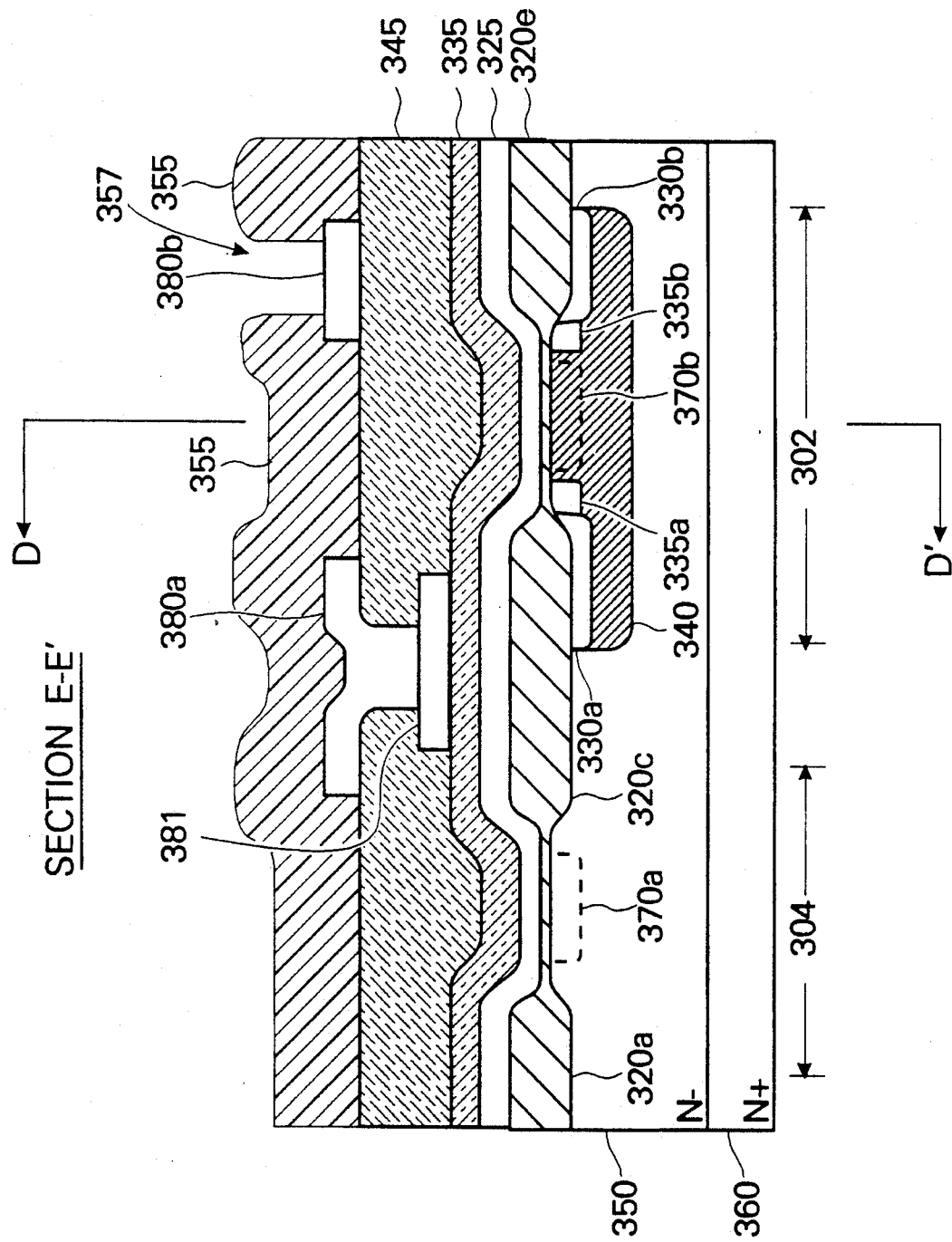
FIG. 3c is a cross-sectional view of a completed CMOS structure incorporating the rad-hard NMOS transistor of the present invention.
Figure 3D:
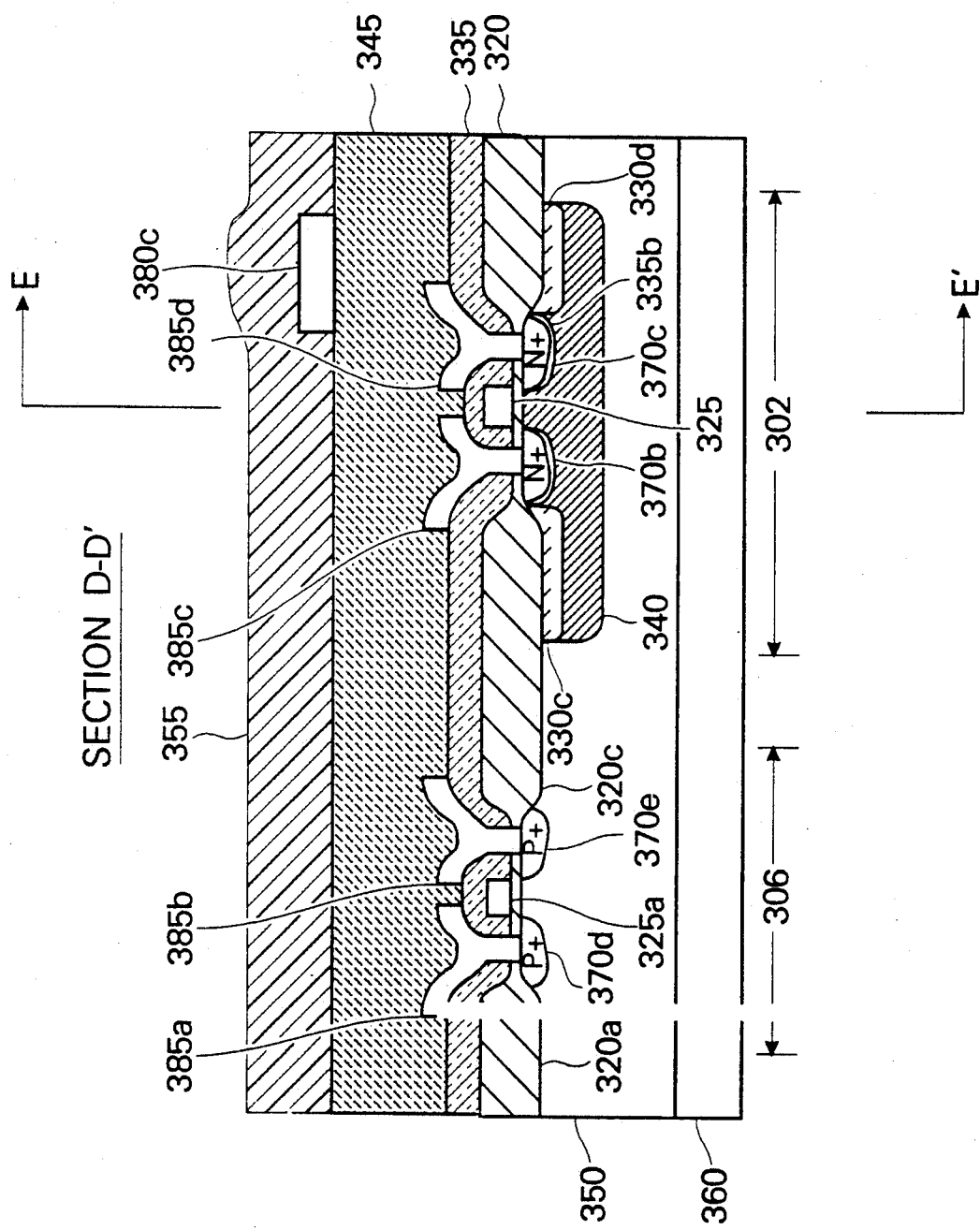
FIG. 3d is a cross-sectional view of the same completed CMOS structure as shown in FIG. 3c, but at right angles to the view of FIG. 3c.

FIG. 3c shows the completed CMOS structure in the same cross-sectional view (now indicated as section E—E' for relation to the cross-sectional view of FIG. 3d). A completed PMOS transistor is shown generally located in the region indicated by 304, and a completed rad-hard NMOS transistor employing the technique of the present invention is shown generally located in the region indicated by 302. In addition to the pre-existing features shown in FIGS. 3a and 3b, a P+ diffusion region 370a is shown underlying thin oxide segment 320b (FIG. 3a) and forming a source/drain of a completed PMOS transistor, an N+ diffusion region 370b is shown underlying thin oxide segment 3d (FIG. 3a) and forming a source/drain of a completed NMOS transistor, and a poly-silicon gate structure 325 and overlying insulating glass 335 have been formed. Further, metal 381 from a first metallization has been deposited, a planar oxide layer been deposited and appropriately etched, metal contacts 380a and 380b from a second metallization have been deposited, and a final overlying insulating oxide 355 has been deposited. Into overlying insulating oxide 355, a hole has been opened (etched) for external access to the contact metal 381b.

It should be noted that the poly-silicon gate structure 325 serves as the gate for both the PMOS transistor and the NMOS transistor. This is typical of CMOS structures, which tend to utilize PMOS and NMOS transistors in complementary pairs, often with common gate connections.

FIG. 3c indicates a section line and viewing direction D—D' by which the cross-sectional view of FIG. 3d is shown.

FIG. 3d shows a cross-sectional view of the same completed CMOS structure, taken at a right angle to the view of FIG. 3d. The NMOS transistor generally indicated by 302 is a right-angle view of the same NMOS transistor depicted in FIG. 3c. The PMOS transistor generally indicated by 306, however, is a different transistor from the one shown in FIG. 3c. Accordingly, a different poly-silicon gate structure 325a is shown for this PMOS transistor 306. P+ diffusion regions 370d and 370e form the source and drain of the PMOS transistor 306, to which contact is made by metal contacts 385a and 385b, respectively, from a first metallization process. Section line and viewing direction E—E' indicate the relation of FIG. 3c (section E—E') to this view. This view also cuts through P— well 340 (shown). Also shown are N+ diffusion regions 370b and 370c forming the source and drain of NMOS transistor 302, to which contact is made by metal contacts 385c and 385d, respectively, from the first metallization process. Metal 381c is shown deposited overlying planarized oxide layer 345.

While FIGS. 3a-3d show many features of typical CMOS structures and their fabrication processes, these are incidental to the present invention, which is concerned mainly with: 1) photo-implantation of P guard bands into the P— well of an NMOS transistor immediately under the bird's beak region of the interface between thin gate oxide and thick field oxide, 2) the resulting rad-hard NMOS transistor structure, and 3) incorporation of NMOS transistors of this type into a suitable CMOS structure to form a radiation hard CMOS device. The remainder of the processes required to create a CMOS device are well known to those skilled in the art of semiconductor processing. The steps discussed herein prior to and after the photo-implantation of the P guard bands are merely exemplary, and any suitable similar CMOS structures and processes may be substituted.

The present invention differs significantly from the prior art (e.g., Structure 6, HATANO 1) in that:

1) While it is advantageous from the point of view of "poly inversion" to pull back the gate structure so that it does not extend beyond the thin gate oxide on one side, the present invention does not require this;

2) P material is used for the guard structure in the present invention rather than P+ material in the prior art, permitting a significantly smaller transistor to be constructed without sacrificing device speed, and permitting the guard structure to be fabricated using less implanter time; and 3) Because metal field inversion is deemed not to be a significant problem, no guard structure is required by the present invention running parallel to the gate structure, permitting a smaller guard structure than that of the prior art, further reducing transistor size and parasitic capacitance.

What is claimed is:

1. A rad-hard NMOS transistor having a gate, a source, and a drain, consisting essentially of:
   a silicon substrate having a top surface;
   a "P—" well formed in the substrate, extending from the top surface of the substrate into the substrate;
   thick field oxide formed in the "P—" well, having two spaced-apart longitudinal portions between which is defined a first area on the top surface of the "P—" well, and extending from the top surface of the "P—" well into the "P—" well;
   a thin gate oxide region overlying the top surface of the "P—" well, extending between and joining the two spaced-apart portions of the field oxide;
   an inner region of the profile of each of the spaced-apart portions of the thick field oxide tapering to an interface with the thin gate oxide, and forming a "bird's beak" region;
   two "P" doped regions, each underlying a respective one of the spaced-apart portions of the thick field oxide, and extending to the bird's beak region;
   two "P" guard bands formed in the substrate, each guard band extending longitudinally along and immediately underneath a respective one of the bird's beak regions, and each guard band in physical and electrical contact with a respective one of the two "P" doped regions, and guard band extending partially under the thin gate oxide;
   a poly-silicon gate structure overlying the thin field oxide and extending across a first portion of the first area between the two spaced-apart portions of the thick field oxide, said first portion of the first area defining a "channel area" in the "P—" well, and positioned such that a second and a third portion of said first area between the two spaced apart portions of the thick field oxide are defined, one on each side of the poly-silicon gate structure, said second and third portions of the first area defining a "source area" and a "drain area", respectively, in the "P—" well and said poly-silicon gate structure being the gate of the rad-hard NMOS transistor; and
   two "N+" diffusion regions formed in the "P—" well, one in the source area and one in the drain area, each immediately underlying the thin field oxide, each extending to the channel area under the poly-silicon gate structure, and each spaced away from the two "P" guard bands, with "N+" diffusion region in the source area forming the source of the rad-hard NMOS transistor and the "N+" diffusion region in the drain area forming the drain of the rad-hard NMOS transistor.

2. A rad-hard NMOS transistor according to claim 1, wherein:
   said poly-silicon gate structure extends over one of the two spaced-apart portions of the thick field oxide.

3. A rad-hard NMOS transistor according to claim 1, wherein:
   said poly-silicon gate structure extends over both of the spaced-apart portions of the thick field oxide.

4. A rad-hard NMOS transistor according to claim 1, wherein:
   the channel area has a length parallel to the thick field oxide portions; and
   the "P" guard bands extend approximately the length of the channel area.

5. A method of forming a rad-hard NMOS transistor, comprising:
   providing a silicon substrate having a top surface;
   forming a "P—" well in the substrate, said "P—" well extending from the top surface of the substrate into the substrate;
   forming thick field oxide in the "P—" well, said thick field oxide having two spaced-apart longitudinal portions between which is defined a first area on the top surface of the "P—" well, and extending from the top surface of the "P—" well into the "P—" well;
   forming a thin gate oxide region overlying the top surface of the "P—" well, said thin gate oxide extending between and joining the two spaced-apart portions of the field oxide;
   an inner region of the profile of each of the spaced-apart portions of the thick field oxide tapering to an interface with the thin gate oxide, and forming a "bird's beak" region;
   implanting two "P" doped regions, each underlying a respective one of the spaced-apart portions of the thick field oxide, and extending to the bird's beak region;

implanting two "P" guard bands into the substrate, each guard band extending longitudinally along and immediately underneath a respective one of the bird's beak regions, and each guard band in physical and electrical contact with a respective one of the two "P" doped regions, and each guard band extending partially under the thin gate oxide;

forming a poly-silicon gate structure overlying the thin field oxide and extending across a first portion of the first area between the two spaced-apart portions of the thick field oxide, said first portion of the first area defining a "channel area" in the "P−" well, and said poly-silicon gate structure positioned such that a second and a third portion of said first area between the two spaced apart portions of the thick field oxide are defined, one on each side of the poly-silicon gate structure, said second and third portions of the first area defining a "source area" and a "drain area", respectively, in the "P−" well and said poly-silicon gate structure forming the gate of the rad-hard NMOS transistor; and forming two "N+" diffusion regions formed in the "P−" well, one in the source area and one in the drain area, each immediately underlying the thin field oxide, each extending to the channel area under the poly-silicon gate structure, and each spaced away from the two "P" guard bands, with the "N+" diffusion region in the source area forming the source of the rad-hard NMOS transistor and the "N+" diffusion region in the drain area forming the drain of the rad-hard NMOS transistor.

6. The method according to claim 5 wherein:
the poly-silicon gate structure is further formed such that it extends over one of the two spaced-apart portions of the thick field oxide.

7. The method according to claim 5 wherein:
the poly-silicon gate structure is further formed such that it extends over both of the two spaced-apart portions of the thick field oxide.

8. The method according to claim 6 wherein:
the two "P" guard bands are implanted by patterning a photo-resist material over the thick field oxide and the thin gate oxide, said photo-resist pattern having elongated openings, and photo-implanting the "P" guard bands through the openings in the photo-resist material.

9. A method according to claim 5, wherein:
the channel area has a length parallel to the thick field oxide portions; and
the "P" guard bands extend approximately the length of the channel area.

10. A rad-hard CMOS structure comprising complementary pairs of NMOS and PMOS transistors, each NMOS and PMOS transistor having a gate, a source and a drain, said NMOS transistors comprising:
a silicon substrate having a top surface;
a "P−" well formed in the substrate, extending from the top surface of the substrate into the substrate;
thick field oxide formed in the "P−" well, having two spaced-apart longitudinal portions between which is defined a first area on the top surface of the "P−" well, and extending from the top surface of the "P−" well into the "P−" well;
a thin gate oxide region overlying the top surface of the "P−" well, extending between and joining the two spaced-apart portions of the field oxide;
an inner region of the profile of each of the spaced-apart portions of the thick field oxide tapering to an interface with the thin gate oxide, and forming a "bird's beak" region;
two "P" doped regions, each underlying a respective one of the spaced-apart portions of the thick field oxide, and extending to the bird's beak region;
two "P" guard bands formed in the substrate, each guard band extending longitudinally along and immediately underneath a respective one of the bird's beak regions, and each guard band in physical and electrical contact with a respective one of the two "P" doped regions, and guard band extending partially under the thin gate oxide;
a poly-silicon gate structure overlying the thin field oxide and extending across a first portion of the first area between the two spaced-apart portions of the thick field oxide, said first portion of the first area defining a "channel area" in the "P−" well, and positioned such that a second and a third portion of said first area between the two spaced apart portions of the thick field oxide are defined, one on each side of the poly-silicon gate structure, said second and third portions of the first area defining a "source area" and a "drain area", respectively, in the "P−" well and said poly-silicon gate structure being the gate of the rad-hard NMOS transistor; and
two "N+" diffusion regions formed in the "P−" well, one in the source area and one in the drain area, each immediately underlying the thin field oxide, each extending to the channel area under the poly-silicon gate structure, and each spaced away from the two "P" guard bands, with "N+" diffusion region in the source area forming the source of the rad-hard NMOS transistor and the "N+" diffusion region in the drain area forming the drain of the rad-hard NMOS transistor.

11. A rad-hard CMOS structure according to claim 10 wherein:
said poly-silicon gate structure of at least one of said NMOS transistors is extended across said thick field oxide such that it forms a poly-silicon gate structure of and common connection to at least one of said PMOS transistors.

12. A rad-hard CMOS structure according to claim 10, wherein:
the channel area has a length parallel to the thick field oxide portions; and
the "P" guard bands extend approximately the length of the channel area.

* * * * *